(12) United States Patent
Yosui et al.

(10) Patent No.: US 9,980,383 B2
(45) Date of Patent: May 22, 2018

(54) LAMINATED CIRCUIT SUBSTRATE

(71) Applicant: Murata Manufacturing Co., Ltd., Nagaokakyo-shi, Kyoto-fu (JP)

(72) Inventors: Kuniaki Yosui, Nagaokakyo (JP); Masahiro Ozawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 404 days.

(21) Appl. No.: 14/748,623

(22) Filed: Jun. 24, 2015

(65) Prior Publication Data
US 2015/0296621 A1 Oct. 15, 2015

Related U.S. Application Data

(63) Continuation of application No. PCT/JP2014/051455, filed on Jan. 24, 2014.

(30) Foreign Application Priority Data

Feb. 15, 2013 (JP) .................. 2013-027581

(51) Int. Cl.
*H01H 47/00* (2006.01)
*H05K 1/16* (2006.01)
(Continued)

(52) U.S. Cl.
CPC ............... *H05K 1/162* (2013.01); *H01G 2/06* (2013.01); *H01G 4/40* (2013.01);
(Continued)

(58) Field of Classification Search
USPC .................. 361/212, 220, 117–119
See application file for complete search history.

(56) References Cited

U.S. PATENT DOCUMENTS 6,359,235 B1 * 3/2002 Hayashi ............ H01L 23/49894
174/255
6,987,307 B2 † 1/2006 White
(Continued)

FOREIGN PATENT DOCUMENTS

JP 5-500136 A 1/1993
JP 07-035414 A 8/1995
(Continued)

OTHER PUBLICATIONS

Official Communication issued in International Patent Application No. PCT/JP2014/051455, dated Mar. 4, 2014.
(Continued)

*Primary Examiner* — Danny Nguyen
(74) *Attorney, Agent, or Firm* — Keating & Bennett, LLP

(57) ABSTRACT

Sheets are laminated on each other and pressure bonded with fixtures from upper and lower directions of a lamination direction while being heated to produce a laminated circuit substrate including therein a capacitor and a coil. The capacitor is defined by a first conductor pattern and a second conductor pattern that face each other across thermoplastic resin layers. In the laminated circuit substrate, the first conductor pattern includes a first principal surface, the second conductor pattern includes a second principal surface, the first principal surface faces the second conductor pattern, the second principal surface faces the first conductor pattern, and the first principal surface and the second principal surface are subject to a roughening process.

17 Claims, 18 Drawing Sheets

(51) Int. Cl.
*H01L 23/498* (2006.01)
*H01G 4/40* (2006.01)
*H01G 2/06* (2006.01)
*H05K 3/46* (2006.01)
*H05K 1/03* (2006.01)
*H05K 1/11* (2006.01)
*H01F 17/00* (2006.01)
*H05K 3/38* (2006.01)

(52) U.S. Cl.
CPC ..... *H01L 23/49822* (2013.01); *H05K 1/0313* (2013.01); *H05K 1/111* (2013.01); *H05K 1/115* (2013.01); *H05K 1/165* (2013.01); *H05K 3/4617* (2013.01); *H01F 17/0006* (2013.01); *H01L 2224/16225* (2013.01); *H01L 2924/19105* (2013.01); *H05K 3/383* (2013.01); *H05K 3/4632* (2013.01); *H05K 2201/0129* (2013.01); *H05K 2201/0355* (2013.01); *H05K 2201/096* (2013.01); *H05K 2201/097* (2013.01); *H05K 2201/09527* (2013.01); *H05K 2201/09672* (2013.01); *H05K 2203/0278* (2013.01); *H05K 2203/0307* (2013.01)

(56) References Cited

U.S. PATENT DOCUMENTS

| 7,808,434 | B2 † | 10/2010 | White |
| 8,345,433 | B2 † | 1/2013 | White |

| 2003/0133275 | A1 | 7/2003 | Miyake et al. |
| 2008/0149374 | A1 | 6/2008 | Harada et al. |
| 2009/0188703 | A1 | 7/2009 | Ito et al. |
| 2012/0043129 | A1* | 2/2012 | Kato ................. H01L 23/49816 174/266 |
| 2012/0097428 | A1* | 4/2012 | Kato ................... H05K 1/0218 174/250 |

FOREIGN PATENT DOCUMENTS

| JP | 2003-332749 A | 11/2003 |
| JP | 2007-317955 A | 12/2007 |
| JP | 2008-160042 A | 7/2008 |
| JP | 2012-015239 A | 1/2012 |
| JP | 2012-186451 A | 9/2012 |
| JP | 2012-195423 A | 10/2012 |
| WO | 91/02647 A1 | 3/1991 |
| WO | 2009/093343 A1 | 7/2009 |
| WO | 2010/113539 A1 | 10/2010 |

OTHER PUBLICATIONS

Official Communication issued in corresponding Japanese Patent Application No. 2015-500170, dated Feb. 9, 2016.

\* cited by examiner
† cited by third party

LAMINATED CIRCUIT SUBSTRATE

BACKGROUND OF THE INVENTION

1. Field of the Invention

The present invention relates to a laminated circuit substrate configured by laminating a plurality of thermoplastic resin layers.

2. Description of the Related Art

International Publication No. 2010/113539 discloses a laminated circuit substrate to be mounted on a communication device such as a smart phone or a mobile phone.

The laminated circuit substrate disclosed in International Publication No. 2010/113539 has been manufactured as follows. First, with respect to a sheet having one side to which a metal film is attached, etching is performed to the metal film. This provides a conductor pattern of a capacitor and a conductor pattern of a coil. A sheet is made of thermoplastic resin. Next, a plurality of the sheets are laminated, heated, and pressure bonded from upper and lower directions of the lamination direction. In this manner, International Publication No. 2010/113539 discloses a laminated circuit substrate including therein a capacitor and a coil has been manufactured.

However, thermoplastic resin softens and flows due to heat and pressure at the time of thermocompression bonding. Therefore, when the laminated circuit substrate disclosed in International Publication No. 2010/113539 is thermocompression bonded, thermoplastic resin between conductor patterns that define a capacitor or a coil may possibly flow in large quantity to the outside of a portion between the conductor patterns, and a distance between the conductor patterns that face each other across thermoplastic resin layers may possibly be changed.

In a case of a capacitor, for example, as the distance between conductor patterns that define the capacitor is changed, the capacitance between the conductor patterns is changed. In addition, in a case of a coil, as the distance between conductor patterns that define the coil is changed, the line capacitance between the conductor patterns is changed. Therefore, when a temperature or pressure affecting the conductor patterns is changed at the time of thermocompression bonding, such element values (capacitance and inductance) are easily changed.

Accordingly, the laminated circuit substrate disclosed in International Publication No. 2010/113539 manufactured by laminating thermoplastic resin layers and thermocompression bonding the layers has a problem that it is hard to provide a capacitor or a coil having a highly accurate element value of which the individual difference is small.

SUMMARY OF THE INVENTION

In view of the foregoing, preferred embodiments of the present invention provide a laminated circuit substrate capable of significantly reducing or preventing a change in element value even when the laminated circuit substrate is manufactured by laminating thermoplastic resin layers and thermocompression bonding the layers.

A laminated circuit substrate is configured by laminating a plurality of thermoplastic resin layers and the laminated circuit substrate includes a first conductor pattern including a first principal surface; a second conductor pattern including a second principal surface, and the first conductor pattern and the second conductor pattern face each other across at least one thermoplastic resin layer of the plurality of thermoplastic resin layers; the first principal surface faces the second conductor pattern; the second principal surface faces the first conductor pattern; and the first principal surface and the second principal surface are subject to a roughening process.

In this configuration, the first conductor pattern and the second conductor pattern define a capacitor or a coil, for example. Further, in this configuration, the first principal surface and the second principal surface are rough. Therefore, when the thermoplastic resin layers are laminated and thermocompression bonded, resin between the first conductor pattern and the second conductor pattern is prevented from flowing by the first principal surface and the second principal surface. Accordingly, at the time of the thermocompression bonding, the resin between the first conductor pattern and the second conductor pattern does not flow much to the outside of a portion between the first conductor pattern and the second conductor pattern.

Therefore, in the case of a capacitor, for example, the distance between the first conductor pattern and the second conductor pattern that define the capacitor is prevented from being changed, so that the capacitance between the first conductor pattern and the second conductor pattern is not easily changed. In addition, in the case of a coil, the distance between the first conductor pattern and the second conductor pattern that define the coil is prevented from being changed, the stray capacitance or the line capacitance between the conductor patterns is not easily changed.

Therefore, even when a temperature or pressure affecting the first conductor pattern and the second conductor pattern is changed in some degree at the time of the thermocompression bonding, such element values (capacitance and inductance) are not easily changed.

Thus, according to this configuration, even when thermoplastic resin layers are laminated on each other and thermocompression bonded to manufacture a laminated circuit substrate, a change in element value is significantly reduced or prevented. Therefore, according to this configuration, it is easy to provide a capacitor or a coil having a highly accurate element value of which the individual difference is small.

The first conductor pattern may further include a third principal surface on the opposite side of the second conductor pattern and the surface roughness of the first principal surface may preferably be larger than the surface roughness of the third principal surface.

In this configuration, the amount of flow of resin near the first principal surface becomes smaller than the amount of flow of resin near the third principal surface. Therefore, at the time of the thermocompression bonding, the amount of flow of resin near the first principal surface becomes even smaller, and the first conductor pattern is further prevented from approaching the second conductor pattern. In other words, this configuration further significantly reduces or prevents a change in element value due to a change in distance between the first conductor pattern and the second conductor pattern.

The second conductor pattern may further include a fourth principal surface on the opposite side of the first conductor pattern and the surface roughness of the second principal surface may preferably be larger than the surface roughness of the fourth principal surface.

In this configuration, the amount of flow of resin near the second principal surface becomes smaller than the amount of flow of resin near the fourth principal surface.

Therefore, at the time of the thermocompression bonding, the amount of flow of resin near the second principal surface becomes further smaller, and the second conductor pattern is further prevented from approaching the first conductor pattern. In other words, this configuration further significantly reduces or prevents a change in element value due to a change in distance between the first conductor pattern and the second conductor pattern.

The first conductor pattern and the second conductor pattern each may preferably be defined by patterning a metal film provided on the surface of the thermoplastic resin layer.

The surface roughness of the first principal surface may preferably be the same or substantially the same as the surface roughness of the second principal surface.

In this configuration, the amount of flow of resin near the first principal surface is the same or substantially the same as the amount of flow of resin near the second principal surface. Therefore, at the time of the thermocompression bonding, one of the first conductor pattern and the second conductor pattern is prevented from approaching the other conductor pattern. In other words, this configuration further significantly reduces or prevents a change in element value due to a change in distance between the first conductor pattern and the second conductor pattern.

The area of the first principal surface may preferably be the same or substantially the same in size as the area of the second principal surface.

In a case in which the area of the second principal surface is larger than the area of the first principal surface, the second conductor pattern includes a region that does not face the first conductor pattern. Contrarily, in a case in which the area of the first principal surface is larger than the area of the second principal surface, the first conductor pattern includes a region that does not face the second conductor pattern. The region that does not face one of the first conductor pattern and the second conductor pattern, at the time of the thermocompression bonding, may be moved to the other conductor pattern due to the flow of resin, which depends on the temperature or pressure affecting the portion between the first conductor pattern and the second conductor pattern.

In this configuration, since the areas of the first principal surface and the second principal surface are the same, such a non-facing region that is described above is not provided. Therefore, at the time of the thermocompression bonding, the non-facing region of one of the first conductor pattern and the second conductor pattern are prevented from moving to the other conductor pattern, due to the flow of resin. In other words, this configuration further significantly reduces or prevents a change in element value due to a change in distance between the first conductor pattern and the second conductor pattern.

It is to be noted that, with this configuration, the first conductor pattern and the second conductor pattern define a capacitor, for example.

The laminated circuit substrate may further include a via hole conductor around a portion between the first conductor pattern and the second conductor pattern in the thermoplastic resin layers.

In this configuration, when the thermoplastic resin layers are laminated and thermocompression bonded, the resin between the first conductor pattern and the second conductor pattern is prevented from flowing by the via hole conductor. Therefore, at the time of the thermocompression bonding, one of the first conductor pattern and the second conductor pattern is prevented from approaching the other conductor pattern. In other words, this configuration further significantly reduces or prevents a change in element value due to a change in distance between the first conductor pattern and the second conductor pattern.

The first conductor pattern and the second conductor pattern may preferably define a capacitor.

The first conductor pattern and the second conductor pattern may preferably define an inductor.

The first conductor pattern may preferably define an inductor and the second conductor pattern may preferably define a ground.

According to various preferred embodiments of the present invention, even when a laminated circuit substrate is manufactured by laminating thermoplastic resin layers and thermocompression bonding the layers, a change in element value is significantly reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 9B is thermocompression bonded.

14B is an enlarged sectional view showing how the portion to be defined as the coil L2 is thermocompression bonded.

Figure 15:
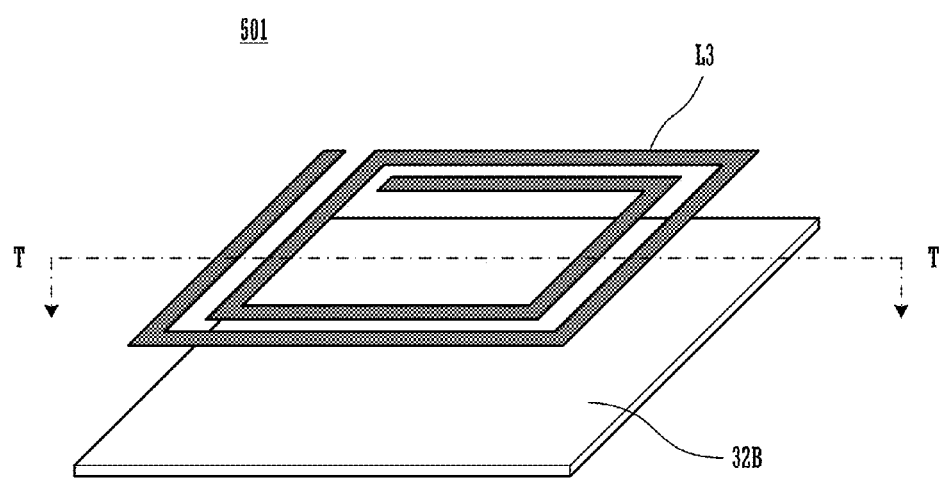

FIG. 15 is an appearance perspective view of a first conductor pattern 32B and a coil L3 included in a laminated circuit substrate 501 according to a fifth preferred embodiment of the present invention.

Figure 16A:
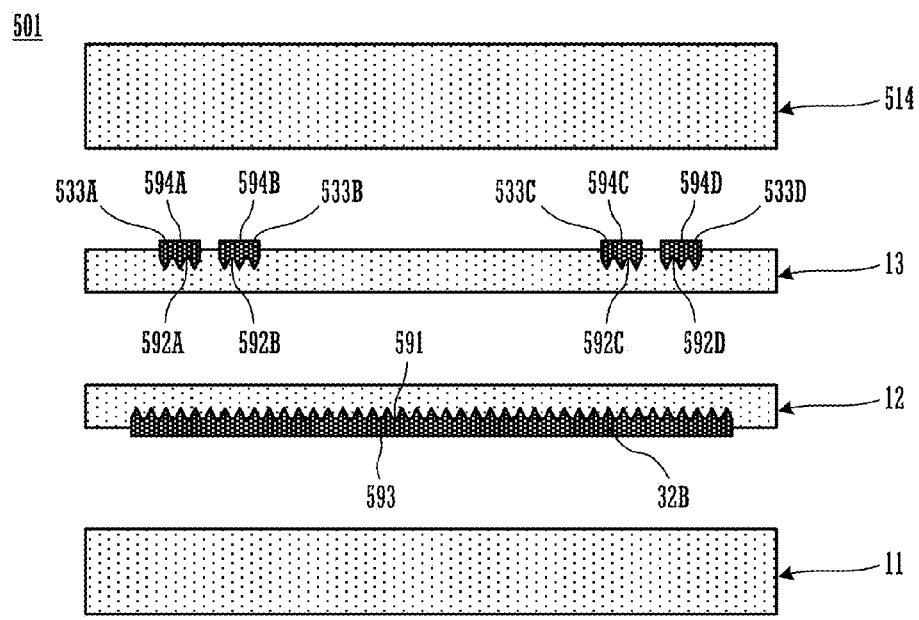
Figure 16B:
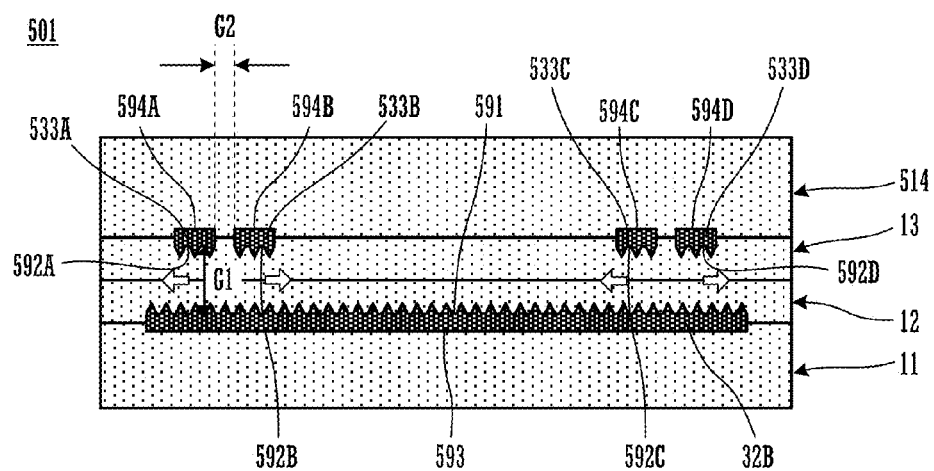

FIG. 16A is an enlarged sectional view of a portion to be defined as the coil L3 shown in FIG. 15. FIG. 16B is an enlarged sectional view showing how the portion to be defined as the coil L3 is thermocompression bonded.

Figure 17:
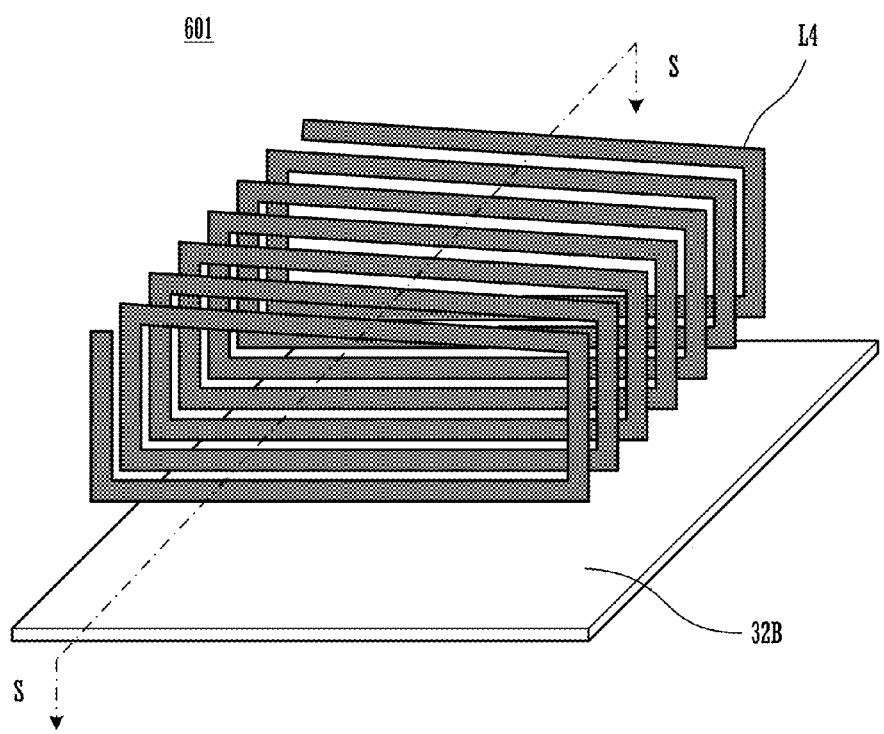

FIG. 17 is an appearance perspective view of a first conductor pattern 32B and a coil L4 included in a laminated circuit substrate 601 according to a sixth preferred embodiment of the present invention.

Figure 18A:
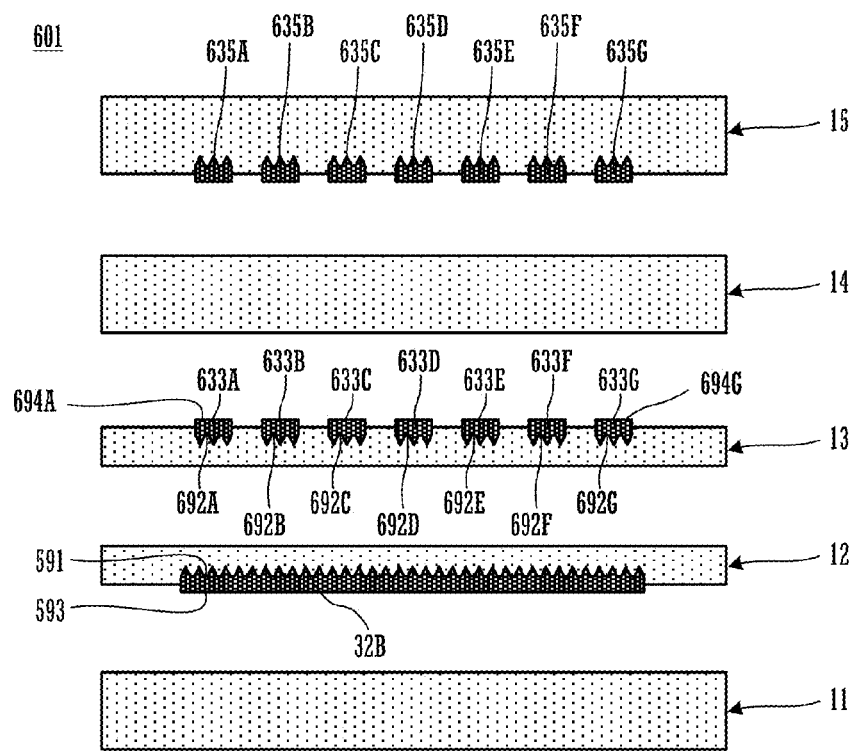
Figure 18B:
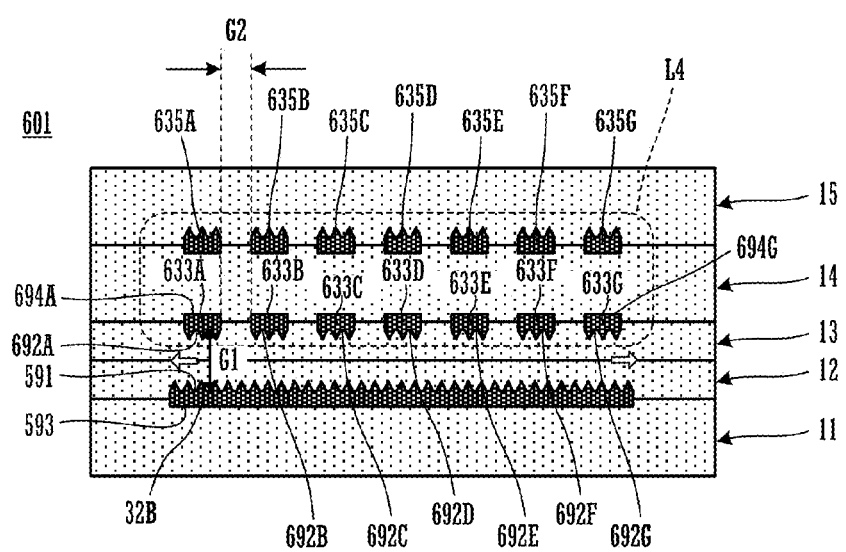

FIG. 18A is an enlarged sectional view of a portion to be defined as the coil L4 shown in FIG. 17. FIG. 18B is an enlarged sectional view showing how the portion to be defined as the coil L4 is thermocompression bonded.

DETAILED DESCRIPTION OF THE PREFERRED EMBODIMENTS

First Preferred Embodiment

Hereinafter, a description will be made of a laminated circuit substrate 101 according to a first preferred embodiment of the present invention.

Figure 1:
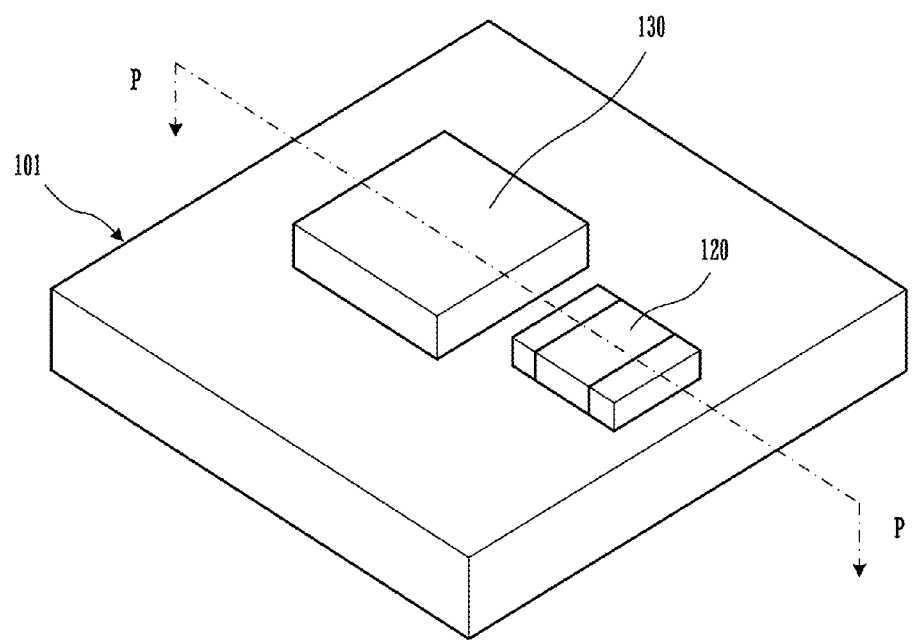
FIG. 1 is an external view of a laminated circuit substrate 101 according to a first preferred embodiment of the present invention.
Figure 2:
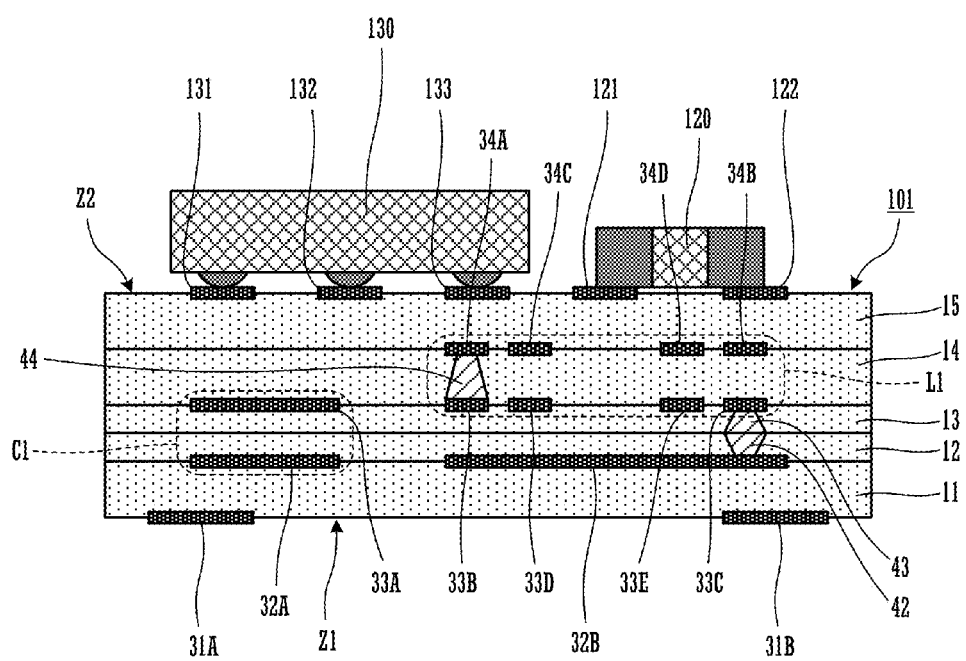
FIG. 2 is a sectional view taken on line P-P of FIG. 1.

FIG. 1 is an external view of a laminated circuit substrate 101 according to a first preferred embodiment of the present invention. FIG. 2 is a sectional view taken on line P-P of FIG. 1. It should be noted that, in the following description, when the laminated circuit substrate 101 is mounted on a printed wiring board (not shown), a surface that is mounted to the laminated circuit substrate 101 is referred to as a principal surface Z1. Similarly, a surface on the opposite side of the principal surface Z1 of the laminated circuit substrate 101 is referred to as a principal surface Z2.

The laminated circuit substrate 101 is provided with a capacitor C1, a coil L1, mounting lands 121, 122, 131, 132, and 133, and external connection terminals 31A and 31B. The laminated circuit substrate 101 has a surface mount configuration. The laminated circuit substrate 101 is a laminate obtained preferably by laminating a plurality of thermoplastic resin made sheets 11 to 15 each on which a conductor pattern is defined. Each of the sheets 11 to 15 has a predetermined dielectric constant.

The capacitor C1 is defined by a first conductor pattern 32A and a second conductor pattern 33A that have a planar shape. In addition, the coil L1 is defined by linear conductor patterns 33B, 33C, 33D, 33E, 34A, 34B, 34C, and 34D and a via hole conductor 44. The conductor patterns 33B, 33C, 33D, 33E, 34A, 34B, 34C, and 34D are arranged so as to overlap with each other in a loop shape when viewed from the lamination direction of the laminated circuit substrate 101. Moreover, the conductor pattern 33C of the coil L1 is coupled to the conductor pattern 32B through via hole conductors 43 and 42.

The external connection terminals 31A and 31B are provided on the principal surface Z1 of the laminated circuit substrate 101. The external connection terminals 31A and 31B are connected to electrodes of, for example, a printed circuit board that is not shown.

The mounting lands 121, 122, 131, 132, and 133 are provided on the principal surface Z2 of the laminated circuit substrate 101. A mounting component 120 is mounted on the mounting lands 121 and 122. A mounting component 130 is mounted on the mounting lands 131, 132, and 133.

It is to be noted that, while the mounting lands 121, 122, 131, 132, and 133 are shown in the figures as mounting lands, the further larger number of mounting lands may be arranged on the principal surface Z2.

Hereinafter, a method of manufacturing the laminated circuit substrate 101 will be described.

Figure 3A:
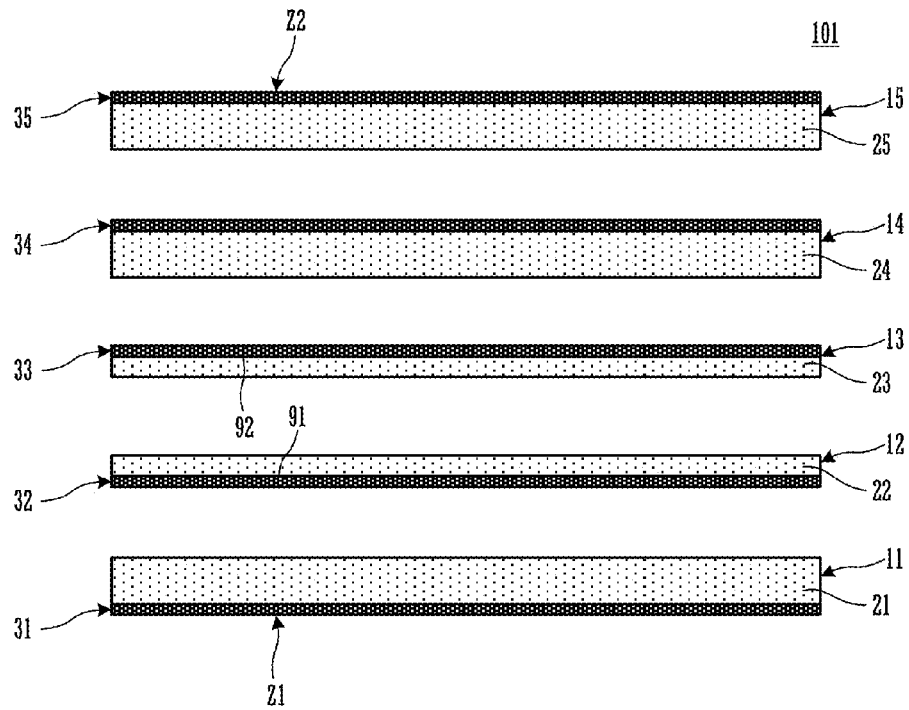
FIG. 3A and FIG. 3B are sectional views showing a method of manufacturing the laminated circuit substrate 101 shown in FIG. 1.
Figure 3B:
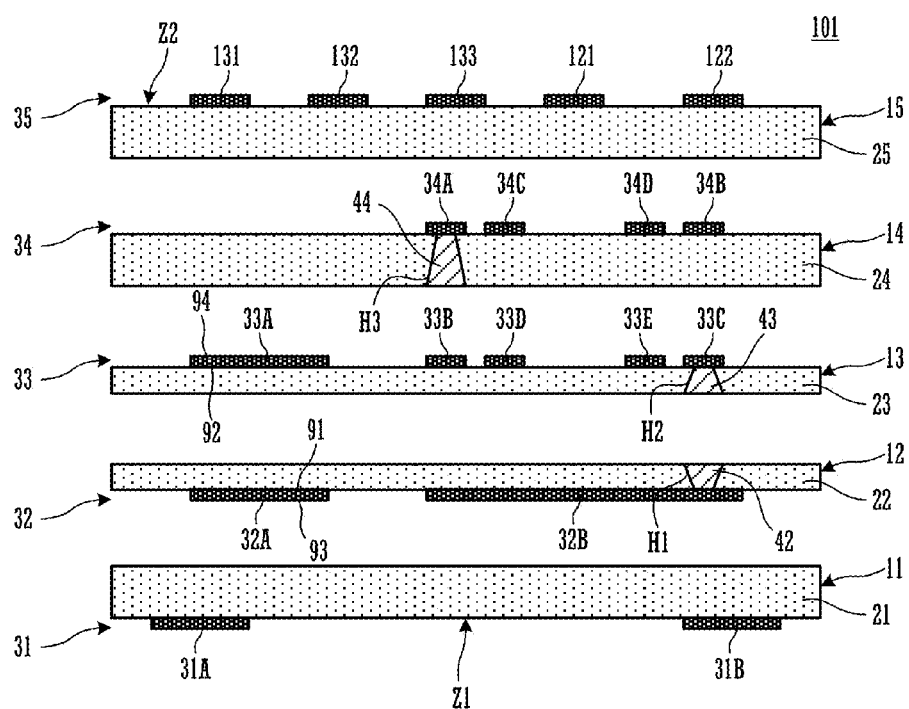

FIG. 3A, FIG. 3B, FIG. 4A, and FIG. 4B are sectional views showing the method of manufacturing the laminated circuit substrate 101 shown in FIG. 1. FIG. 5A is an enlarged sectional view of a portion to be defined as a capacitor C1 shown in FIG. 3B. FIG. 5B is an enlarged sectional view showing how the portion to be defined as the capacitor C1 shown in FIG. 3B is being thermocompression bonded.

It should be noted that FIG. 3A, FIG. 3B, FIG. 4A, and FIG. 4B show only a portion to be defined as a single laminated circuit substrate 101. In other words, in practice, a large number of portions each of which is to be defined as a laminated circuit substrate 101 are provided on a sheet to form a plurality of laminated circuit substrates 101 at one time, and then the laminated circuit substrates 101 are cut into pieces to manufacture the single laminated circuit substrate 101.

To begin with, as shown in FIG. 3A, sheets 11 to 15 are prepared. The external shape of each of the sheets 11 to 15 in a front view from the lamination direction is rectangular or substantially rectangular.

The sheet 11 is provided with a thermoplastic resin layer 21 and a metal film 31. The metal film 31 is attached on the principal surface of the sheet 11 on the side of the principal surface Z1 of the thermoplastic resin layer 21. The sheet 12 is provided with a thermoplastic resin layer 22 and a metal film 32. The metal film 32 is attached on the principal surface of the sheet 12 on the side of the principal surface Z1 of the thermoplastic resin layer 22.

The sheet 13 is provided with a thermoplastic resin layer 23 and a metal film 33. The metal film 33 is attached on the principal surface of the sheet 13 on the side of the principal surface Z2 of the thermoplastic resin layer 23. The sheet 14 is provided with a thermoplastic resin layer 24 and a metal film 34. The metal film 34 is attached on the principal surface of the sheet 14 on the side of the principal surface Z2 of the thermoplastic resin layer 24. The sheet 15 is provided with a thermoplastic resin layer 25 and a metal film 35. The metal film 35 is attached on the principal surface of the sheet 15 on the side of the principal surface Z2 of the thermoplastic resin layer 25.

It is to be noted that the metal film is strongly fixed on each sheet by the anchor effect. In other words, of the two principal surfaces of the metal film, one principal surface fixed on the sheet is a roughened surface (mat side) and the other principal surface is a glossy surface (shiny side).

The material of the thermoplastic resin layers 21 to preferably is a liquid crystal polymer, for example. The material of the metal films 31 to 35 is copper as a metal foil, for example. It should be noted that, for the thermoplastic resin layers 21 to 25, besides a liquid crystal polymer, thermoplastic resin having heat resistance and flexibility, such as thermoplastic polyimide, may be used. As the metal films 31 to 35, a metal foil such as silver besides copper, may be used.

It is to be noted that, while described below in detail, the sheet 12 uses a sheet of which the principal surface on the side of the principal surface Z2 of the metal film 32 has previously been subject to a roughening process. The principal surface on the side of the principal surface Z2 of the metal film 32 is a surface including the first principal surface 91 to be described hereinafter. Similarly, the sheet 13 uses a sheet of which the principal surface on the side of the principal surface Z1 of the metal film 33 has previously been subject to the roughening process. The principal surface on the side of the principal surface Z1 of the metal film 33 is a surface including the second principal surface 92 to be described hereinafter.

Subsequently, as shown in FIG. 3B, the metal films 31 to 35 of the sheets 11 to 15 are patterned mainly by etching. As a result, the mounting lands 121, 122, 131, 132, and 133, the external connection terminals 31A and 31B, the first conductor pattern 32A and the second conductor pattern 33A that define the capacitor C1, and conductor patterns 33B, 33C, 33D, 33E, 34A, 34B, 34C, and 34D that define the coil L1 are provided.

In addition, other wiring conductors (not shown) used to connect the conductor patterns 32A, 33A, 33B, 33C, 33D, 33E, 34A, 34B, 34C, and 34D are also provided simultaneously. In the present preferred embodiment, the area of the first principal surface 91 that faces the second conductor pattern 33A in the first conductor pattern 32A is the same or substantially the same in size as the area of the second principal surface 92 that faces the first conductor pattern 32A in the second conductor pattern 33A.

Furthermore, as shown in FIG. 3B, when the thermoplastic resin layers 22 to 24 of the sheets 12 to 14 are irradiated with laser beams or the like, the laser beams do not pass through the metal films 32 to 34 but pass completely through the thermoplastic resin layers 22 to 24. After through holes H1 to H3 are provided in the thermoplastic resin layers 22 to 24 in this manner, a conductive material such as conductive paste mainly composed of silver and tin is filled in the through holes H1 to H3.

Figure 4A:
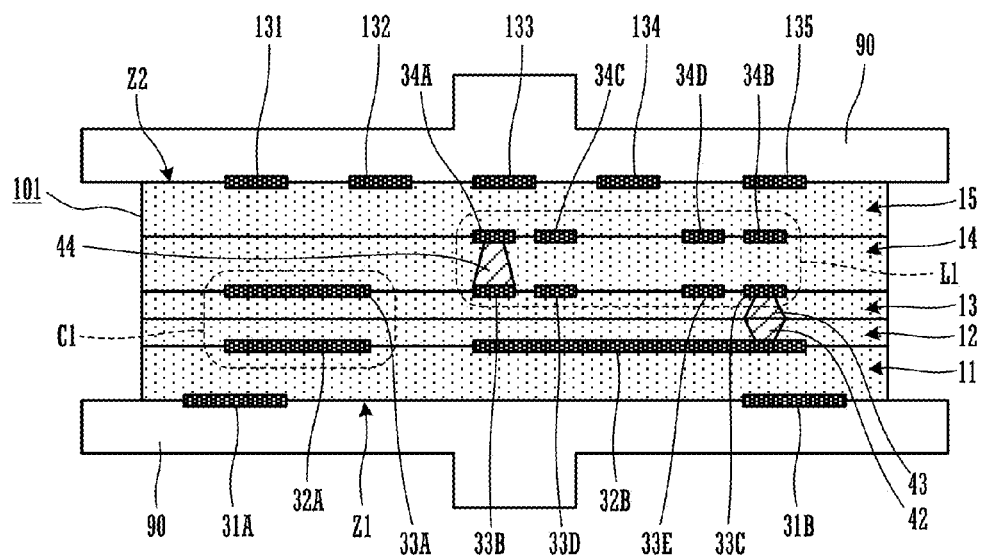
FIG. 4A and FIG. 4B are sectional views showing a method of manufacturing the laminated circuit substrate 101 shown in FIG. 1.
Figure 4B:
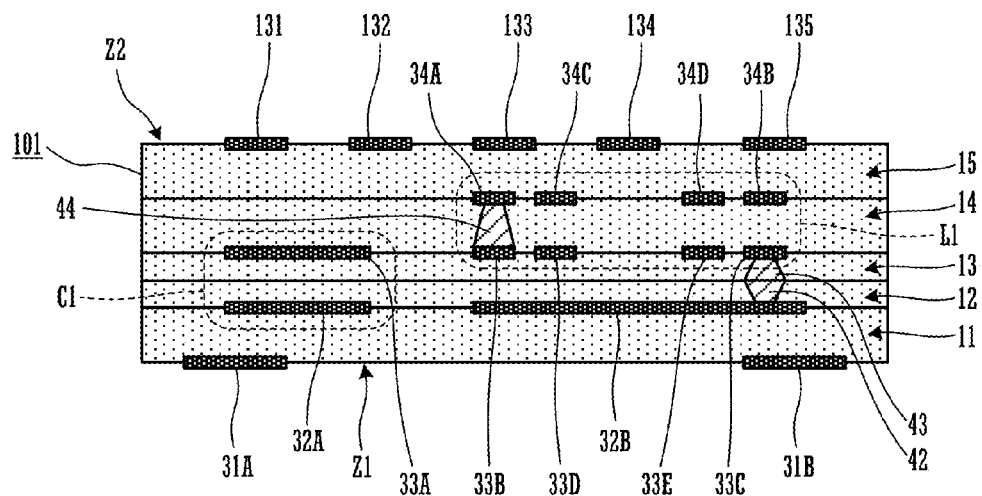
Figure 5A:
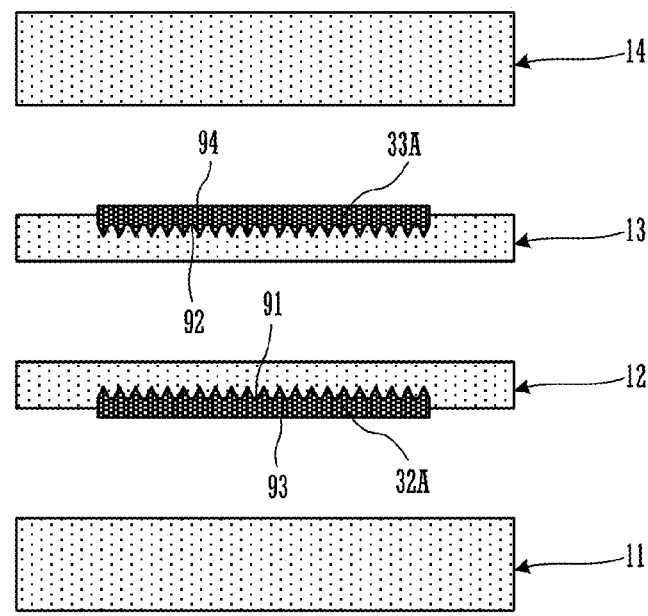
FIG. 5A is an enlarged sectional view of a portion to be defined as a capacitor C1 shown in FIG. 3B.
Figure 5B:
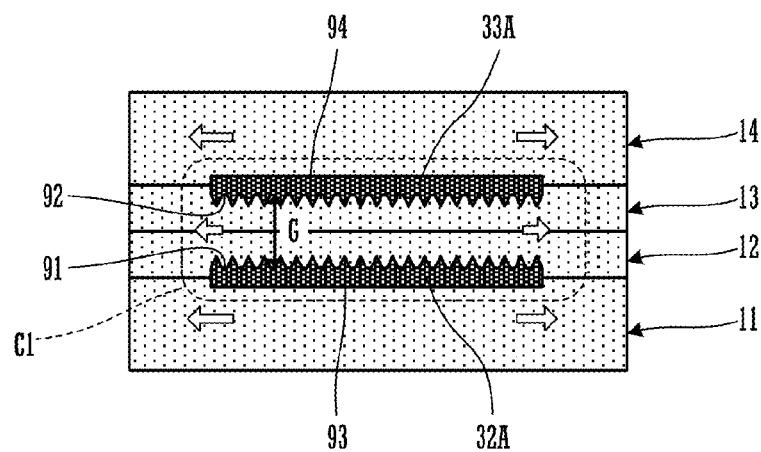
FIG. 5B is an enlarged sectional view showing how the portion to be defined as the capacitor C1 is thermocompression bonded.

Subsequently, as shown in FIG. 4A, the sheets 11 to 15 are laminated on each other and compression bonded from upper and lower directions of the lamination direction with a fixture such as a pressing plate while heated at a temperature of 300° C., for example. Accordingly, while each sheet 11 to 15 is softened and fluidized to be integrated, the conductive paste filled into the through holes is metallized (sintered). This, as shown in FIG. 4B, manufactures the laminated circuit substrate 101 provided therein with the capacitor C1 and the coil L1. The capacitor C1 is defined by the first conductor pattern 32A and the second conductor pattern 33A that face each other across the thermoplastic resin layers 22 and 23.

Subsequently, the mounting components 120 and 130 are mounted on the mounting lands 121, 122, 131, 132, and 133 of the laminated circuit substrate 101 (see FIG. 1 and FIG. 2). Then, the laminated circuit substrate 101 is mounted on a printed wiring board that is not shown, and the external connection terminals 31A and 31B are connected to the electrodes of the printed circuit board.

In the present preferred embodiment, the thermoplastic resin of the sheets 11 to 15 is softened and fluidized by the heat and pressure at the time of thermocompression bonding and is integrated without using an adhesives layer such as a bonding sheet or prepreg. Therefore, also in the laminated circuit substrate 101, at the time of thermocompression bonding, the thermoplastic resin between the first conductor pattern 32A and the second conductor pattern 33A that define the capacitor C1 flows to the outside of the portion between the first conductor pattern 32A and the second conductor pattern 33A.

However, in the laminated circuit substrate 101, the roughening process is performed to the first principal surface that faces the second conductor pattern 33A in the first conductor pattern 32A (see FIG. 5A). Moreover, in the laminated circuit substrate 101, the roughening process is performed also to the second principal surface 92 that faces the first conductor pattern 32A in the second conductor pattern 33A (see FIG. 5A). The roughening process includes etching, for example.

By the roughening process, the surface roughness of the first principal surface 91 is larger than the surface roughness of the third principal surface 93 on the opposite side of the second conductor pattern 33A in the first conductor pattern 32A. In addition, by the roughening process, the surface roughness of the second principal surface 92 is larger than the surface roughness of the fourth principal surface 94 on the opposite side of the first conductor pattern 32A in the second conductor pattern 33A.

It should be noted that the surface roughness of the first principal surface 91 preferably is about 1.3 µm to about 15 µm, for example, and preferably is about 2.7 µm in the present preferred embodiment, for example. The surface roughness of the first principal surface 91 preferably is the same or substantially the same as the surface roughness of the second principal surface 92. It is to be noted that, as the surface roughness in the present preferred embodiment, the maximum height roughness [Rz] defined by [JIS B 0601-2001] is adopted. In addition, the surface roughness of the third principal surface 93 and the fourth principal surface 94 preferably is about 0.1 µm to about 3 µm, for example, and preferably about 1.5 µm in the present preferred embodiment, for example.

In the laminated circuit substrate 101, the first principal surface 91 and the second principal surface 92 are rough. Therefore, when the sheets 11 to 15 are laminated on each other and thermocompression bonded, resin between the first conductor pattern 32A and the second conductor pattern 33A is prevented from flowing by the first principal surface 91 and the second principal surface 92. Accordingly, at the time of the thermocompression bonding, the resin between the first conductor pattern 32A and the second conductor pattern 33A does not flow much to the outside of the portion between the first conductor pattern 32A and the second conductor pattern 33A (see the arrows in FIG. 5B).

Then, since the surface roughness of the first principal surface 91 is larger than the surface roughness of the third principal surface 93, the amount of flow of resin near the first principal surface 91 is smaller than the amount of flow of resin near the third principal surface 93. In addition, since the surface roughness of the second principal surface 92 is also larger than the surface roughness of the fourth principal surface 94, the amount of flow of resin near the second principal surface 92 is smaller than the amount of flow of resin near the fourth principal surface 94. The size of the arrows as shown in FIG. 5B represents the amount of flow of resin.

The amount of flow of resin near the third principal surface 93 and resin near the fourth principal surface 94 is larger than the amount of flow of resin near the first principal surface 91 and resin near the second principal surface 92.

Therefore, the resin near the first principal surface 91 and the resin near the second principal surface 92 become much more difficult to flow to the outside of the portion between the first conductor pattern 32A and the second conductor pattern 33A.

Thus, the distance G between the first conductor pattern 32A and the second conductor pattern 33A that define the capacitor C1 is prevented from being changed, so that the capacitance between the first conductor pattern 32A and the second conductor pattern 33A is not easily changed. In other words, when the laminated circuit substrate 101 is being manufactured by thermocompression bonding, the designed distance G and capacitance between the first conductor pattern 32A and the second conductor pattern 33A is able to be exactly or almost exactly achieved.

Therefore, even when a temperature or pressure affecting the first conductor pattern 32A and the second conductor pattern 33A is changed to some degree at the time of the thermocompression bonding, such an element value (capacitance in the present preferred embodiment) of the capacitor C1 is not easily changed.

Accordingly, according to the laminated circuit substrate 101, even when the sheets 11 to 15 are laminated on each other and thermocompression bonded to manufacture the laminated circuit substrate 101, the change in element value is able to be prevented. Therefore, according to the laminated circuit substrate 101, it is easy to provide a capacitor C1 having a highly accurate element value (capacitance in the present preferred embodiment) of which the individual difference is small.

In addition, as described above, the surface roughness of the first principal surface 91 is the same or substantially the same as the surface roughness of the second principal surface 92. Therefore, the amount of flow of resin near the first principal surface 91 is the same or substantially the same as the amount of flow of resin near the second principal surface 92. Accordingly, at the time of the thermocompression bonding, the end of one conductor pattern of the first conductor pattern 32A and the second conductor pattern 33A is prevented from approaching closer to the other conductor pattern than to a central portion positioned inside the end. In other words, this configuration further significantly reduces or prevents a change in element value due to a change in distance between the first conductor pattern 32A and the second conductor pattern 33A.

In a case in which the area of the second principal surface 92 is larger than the area of the first principal surface 91, the second conductor pattern includes a region that does not face the first conductor pattern 32A. Contrarily, in a case in which the area of the first principal surface 91 is larger than the area of the second principal surface 92, the first conductor pattern 32A includes a region that does not face the second conductor pattern 33A. Such a non-facing region that does not face one of the first conductor pattern 32A and the second conductor pattern 33A, at the time of the thermocompression bonding, may be moved to the other conductor pattern due to the flow of resin, which depends on the temperature or pressure affecting the portion between the first conductor pattern 32A and the second conductor pattern 33A.

The laminated circuit substrate 101, as described above, since the area of the first principal surface 91 and the area of the second principal surface 92 are the same in size, does not include the non-facing region. Therefore, at the time of the thermocompression bonding, the non-facing region of one of the first conductor pattern 32A and the second conductor pattern 33A is prevented from moving to the other conductor pattern, due to the flow of resin. In other words, this configuration further significantly reduces or prevents a change in element value due to a change in distance G between the first conductor pattern 32A and the second conductor pattern 33A.

Second Preferred Embodiment

Hereinafter, a description will be made of a laminated circuit substrate 201 according to a second preferred embodiment of the present invention.

Figure 6A:
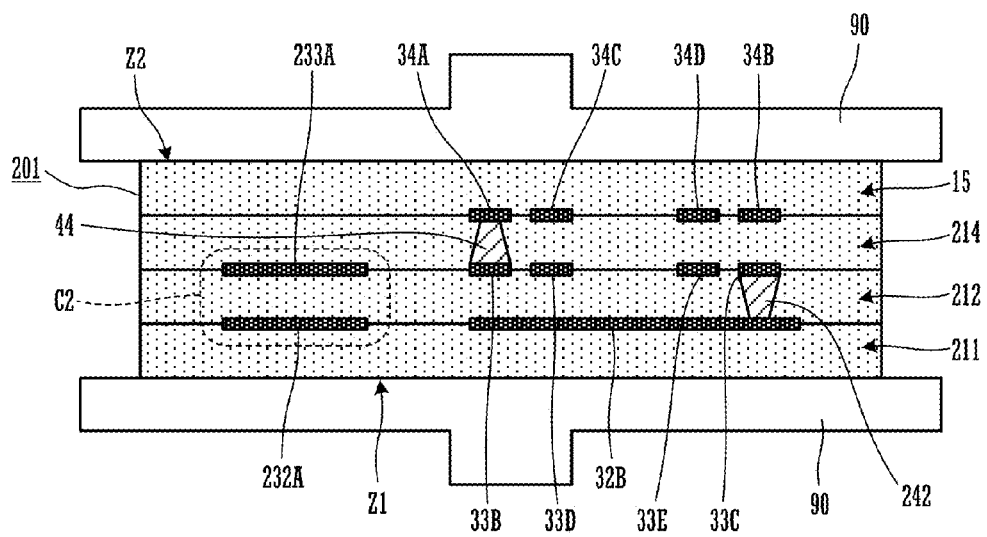
FIG. 6A and FIG. 6B are sectional views showing a method of manufacturing a laminated circuit substrate 201 according to a second preferred embodiment of the present invention.
Figure 6B:
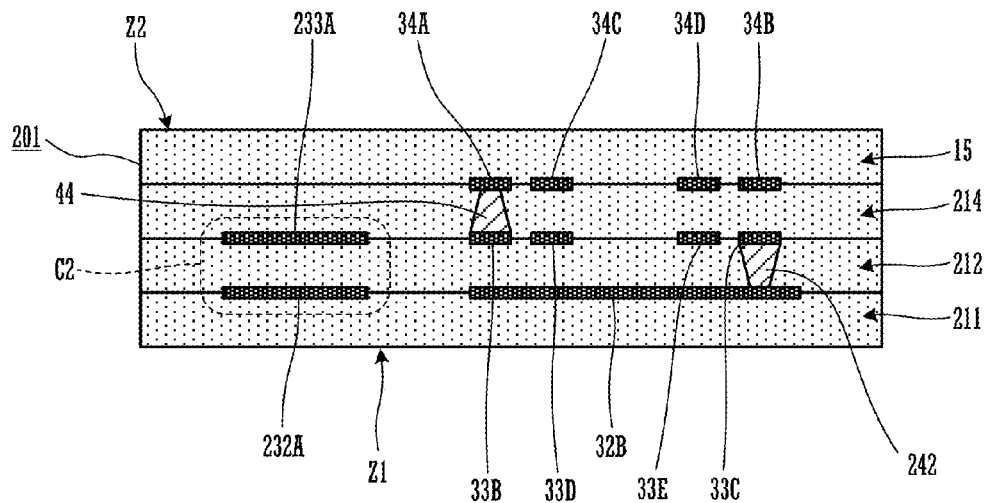
Figure 7A:
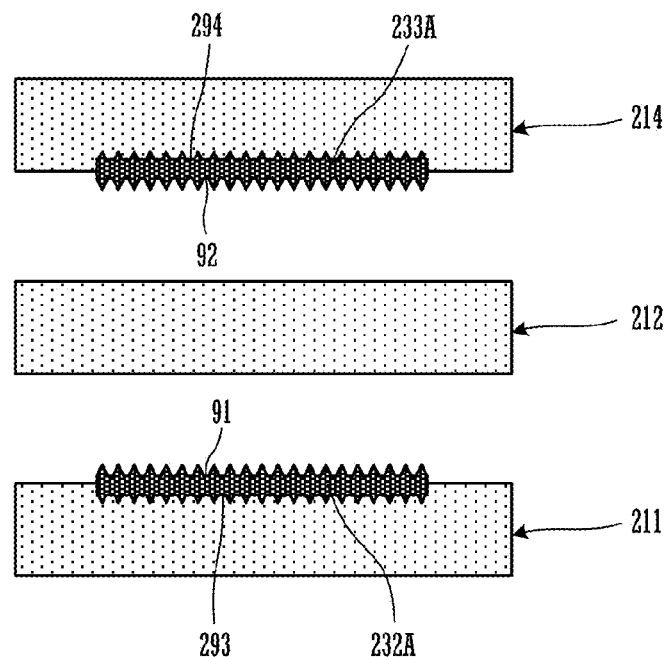
FIG. 7A is an enlarged sectional view of a portion to be defined as a capacitor C2 shown in FIG. 6A and FIG. 6B.
Figure 7B:
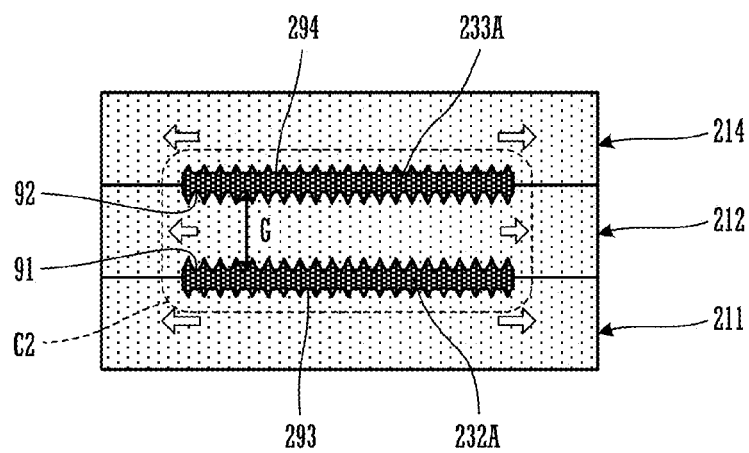
FIG. 7B is an enlarged sectional view showing how the portion to be defined as the capacitor C2 is thermocompression bonded.

FIG. 6A and FIG. 6B are sectional views showing a method of manufacturing the laminated circuit substrate 201 according to the second preferred embodiment of the present invention. FIG. 7A is an enlarged sectional view of a portion to be defined as a capacitor C2 shown in FIG. 6A and FIG. 6B. FIG. 7B is an enlarged sectional view showing how the portion to be defined as the capacitor C2 is being thermocompression bonded.

The laminated circuit substrate 201 according to the second preferred embodiment of the present invention is different from the laminated circuit substrate 101 according to the first preferred embodiment of the present invention in that the laminated circuit substrate 201 is provided with a capacitor C2 and sheets 211, 212, and 214 instead of the capacitor C1 and the sheets 11 to 14. The sheet 212 includes a via hole conductor 242 instead of the via hole conductors 42 and 43 of the sheets 12 and 13. Since the other configurations of the laminated circuit substrate 201 are the same or substantially the same as the configurations of the laminated circuit substrate 101, the description thereof will be omitted. The method of manufacturing the laminated circuit substrate 201 is also the same or substantially the same as the method of manufacturing the laminated circuit substrate 101 and thus the description thereof will be omitted.

More specifically, even in the laminated circuit substrate 201, the roughening process is performed to the first principal surface 91 that faces the second conductor pattern 233A in the first conductor pattern 232A (see FIG. 7A). Moreover, the roughening process is performed also to the second principal surface 92 that faces the first conductor pattern 232A in the second conductor pattern 233A (see FIG. 7A).

In the laminated circuit substrate 201, the roughening process is further performed to the third principal surface 293 on the opposite side of the second conductor pattern 233A in the first conductor pattern 232A (see FIG. 7A). Furthermore, in the laminated circuit substrate 201, the roughening process is performed to the fourth principal surface 294 on the opposite side of the second conductor pattern 233A in the first conductor pattern 232A (see FIG. 7A).

However, the surface roughness of the first principal surface 91 is larger than the surface roughness of the third principal surface 293 on the opposite side of the second conductor pattern 233A in the first conductor pattern 232A. In addition, the surface roughness of the second principal surface is also larger than the surface roughness of the fourth principal surface 294 on the opposite side of the first conductor pattern 232A in the second conductor pattern 233A.

It should be noted that the surface roughness of the first principal surface 91 and the second principal surface 92 preferably is about 1.3 μm to about 15 μm, for example. The surface roughness of the third principal surface 293 and the fourth principal surface 294 preferably is about 0.1 μm to about 3 μm, for example.

As described above, also in the laminated circuit substrate 201, the first principal surface 91 and the second principal surface 92 are rough. Therefore, when the sheets 211, 212, 214, and 15 are laminated on each other and thermocompression bonded, resin between the first conductor pattern 232A and the second conductor pattern 233A is prevented from flowing by the first principal surface 91 and the second principal surface 92. Thus, at the time of the thermocompression bonding, the resin between the first conductor pattern 232A and the second conductor pattern 233A does not flow much to the outside of the portion between the first conductor pattern 232A and the second conductor pattern 233A (see the arrows in FIG. 7B).

Then, since the surface roughness of the first principal surface 91 is larger than the surface roughness of the third principal surface 293, the amount of flow of resin near the first principal surface 91 is smaller than the amount of flow of resin near the third principal surface 293. In addition, since the surface roughness of the second principal surface 92 is also larger than the surface roughness of the fourth principal surface 294, the amount of flow of resin near the second principal surface 92 is smaller than the amount of flow of resin near the fourth principal surface 294. The size of the arrows as shown in FIG. 7B represents the amount of flow of resin.

However, since the surface roughness of the third principal surface 293 is larger than the surface roughness of the third principal surface 93 shown in FIGS. 5A and 5B, the amount of flow of resin near the third principal surface 293 is smaller than the amount of flow of resin near the third principal surface 93. In addition, since the surface roughness of the fourth principal surface 294 is also larger than the surface roughness of the fourth principal surface 94 shown in FIGS. 5A and 5B, the amount of flow of resin near the fourth principal surface 294 is smaller than the amount of flow of resin near the fourth principal surface 94. The amount of flow of resin near the third principal surface 293 and resin near the fourth principal surface 294 is larger than the amount of flow of resin near the first principal surface 291 and resin near the second principal surface 292. Thus, the resin near the first principal surface 291 and the resin near the second principal surface 292 become much more difficult to flow to the outside of the portion between the first conductor pattern 232A and the second conductor pattern 233A.

Accordingly, also in the laminated circuit substrate 201, the distance G between the first conductor pattern 232A and the second conductor pattern 233A that define the capacitor C2 is prevented from being changed, so that the capacitance between the first conductor pattern 232A and the second conductor pattern 233A is not easily changed. In other words, when the laminated circuit substrate 201 is being manufactured by thermocompression bonding, the designed distance G and capacitance between the first conductor pattern 232A and the second conductor pattern 233A are exactly or almost exactly achieved.

Therefore, even when a temperature or pressure affecting the first conductor pattern 232A and the second conductor pattern 233A is changed to some degree at the time of the thermocompression bonding, such an element value (capacitance in the present preferred embodiment) of the capacitor C2 is not easily changed.

Consequently, the laminated circuit substrate 201 also achieves advantages that are the same or substantially the same as the advantages of the laminated circuit substrate 101.

Figure 8A:
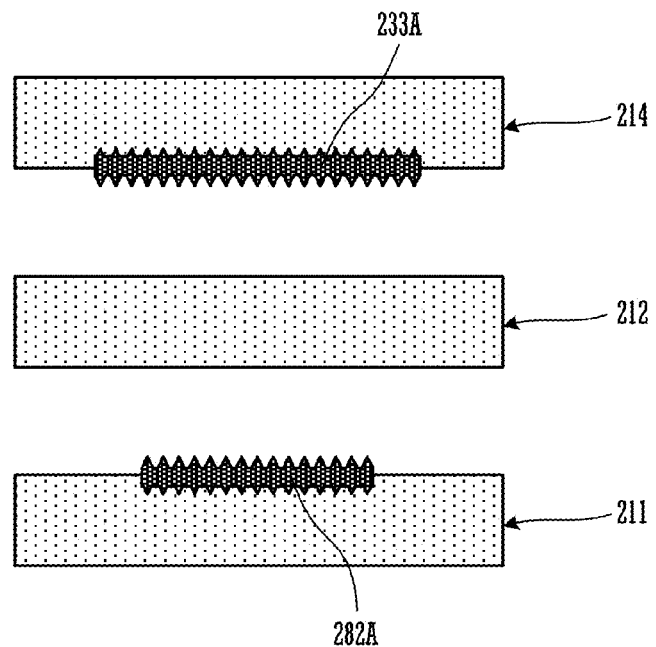
FIG. 8A is an enlarged sectional view of a portion to be defined as a capacitor C3 according to a variant preferred embodiment of the capacitor C2 shown in FIG. 6A and FIG. 6B.
Figure 8B:
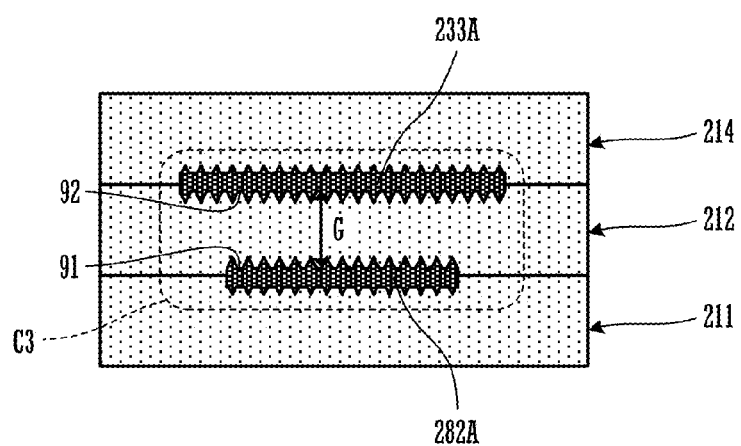
FIG. 8B is an enlarged sectional view showing how the portion to be defined as a capacitor C3 is thermocompression bonded.

It is to be noted that, in the first and second preferred embodiments, the area of the first principal surface is preferably the same in size as the area of the second principal surface 92, which is not limited thereto. For example, as shown in FIGS. 8A and 8B, a conductor pattern 282A on which the area of the first principal surface 91 is smaller than the area of the second principal surface 92 may be provided on the sheet 211.

Third Preferred Embodiment

Hereinafter, a description will be made of a laminated circuit substrate 301 according to a third preferred embodiment of the present invention.

Figure 9A:
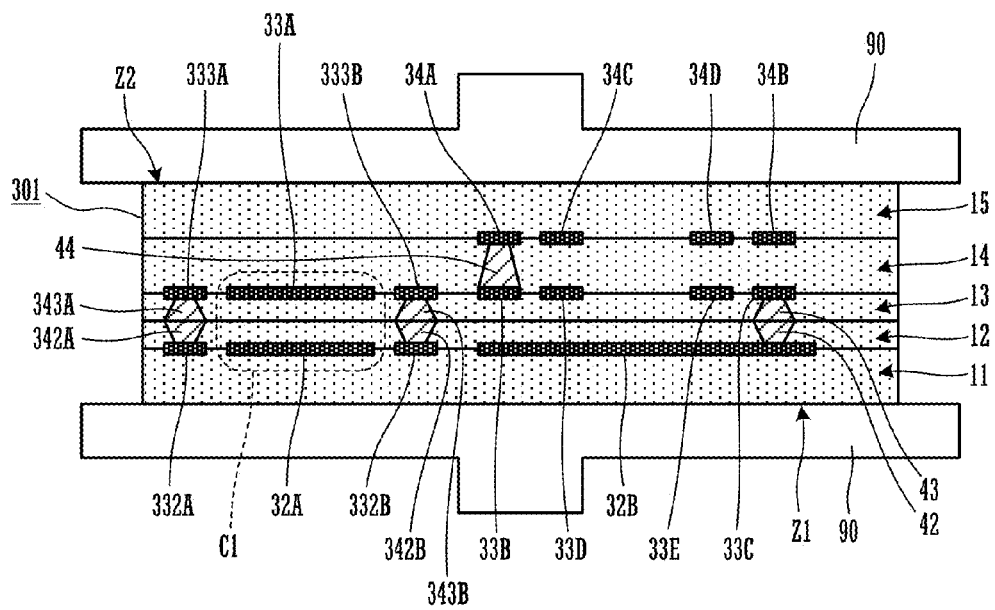
FIG. 9A and FIG. 9B are sectional views showing a method of manufacturing a laminated circuit substrate 301 according to a third preferred embodiment of the present invention.
Figure 9B:
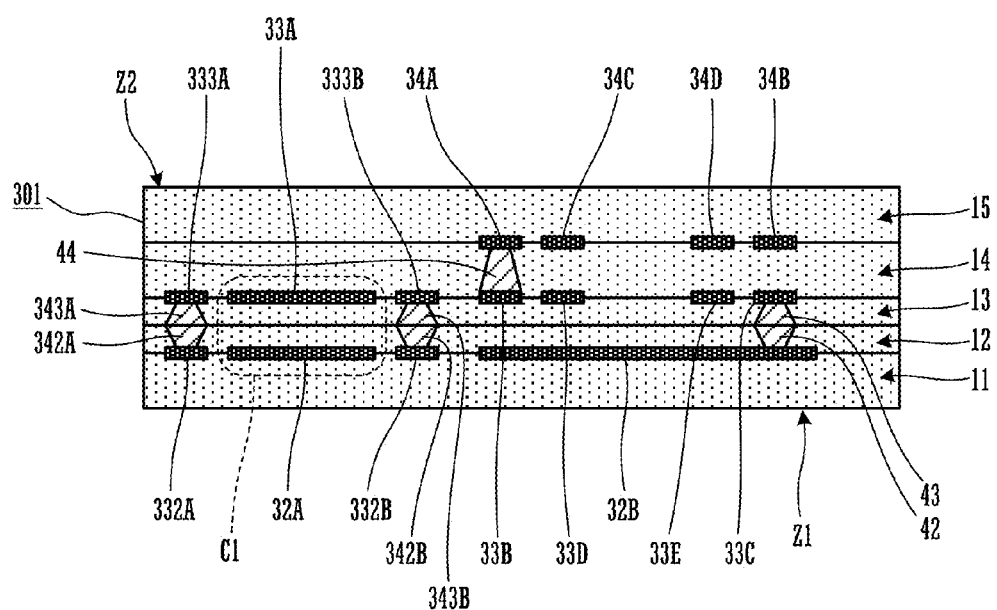
Figure 10:
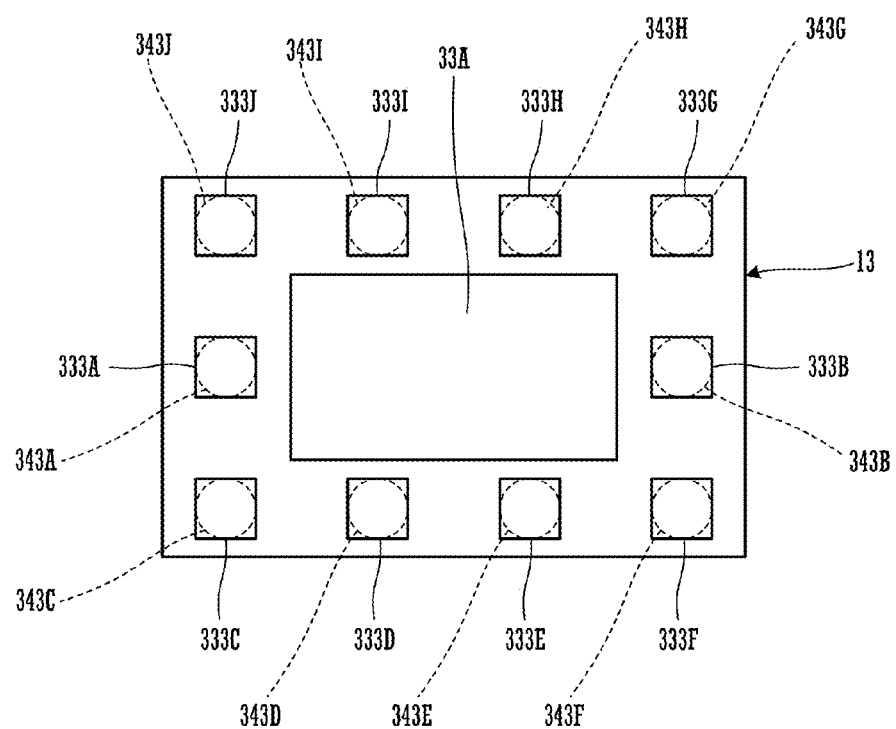
FIG. 10 is a front view of a main portion of a sheet 13 shown in FIG. 9A and FIG. 9B.
Figure 11:
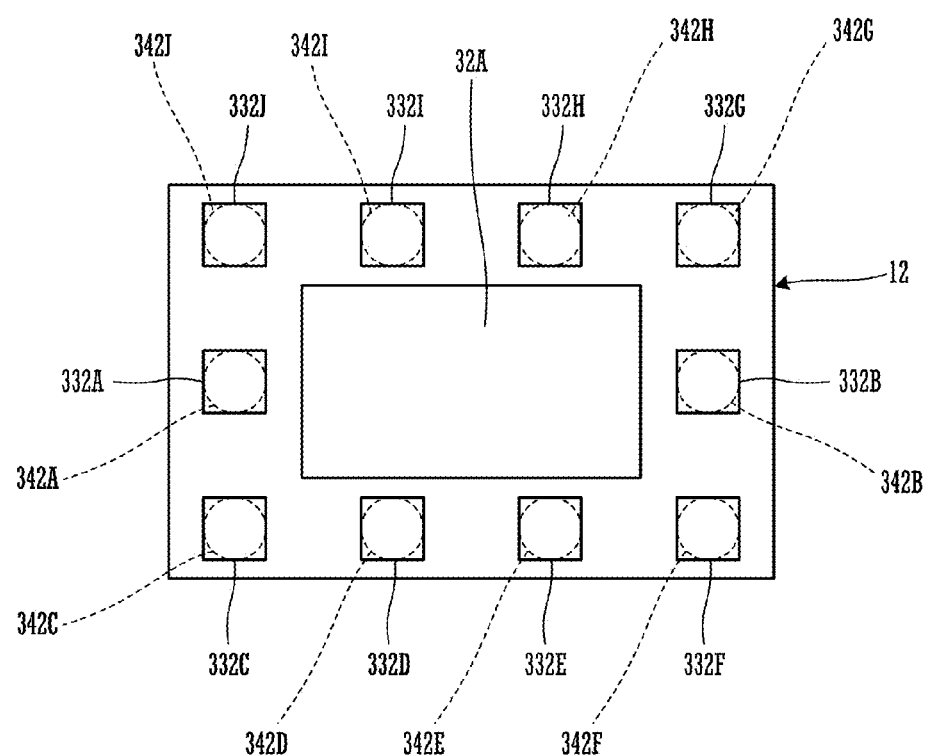
FIG. 11 is a front view of a main portion of a sheet 12 shown in FIG. 9A and FIG. 9B.
Figure 12A:
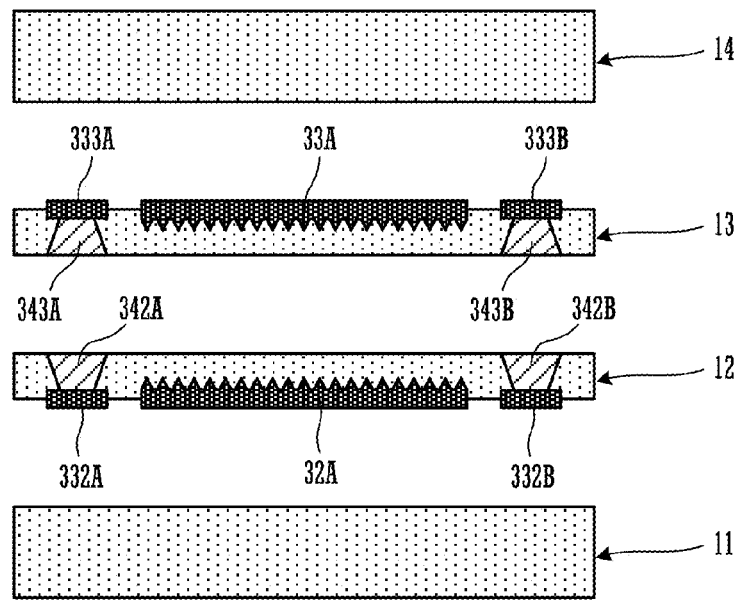
FIG. 12A is an enlarged sectional view of a portion to be defined as a capacitor C1 shown in FIG. 9A and FIG. 9B.
Figure 12B:
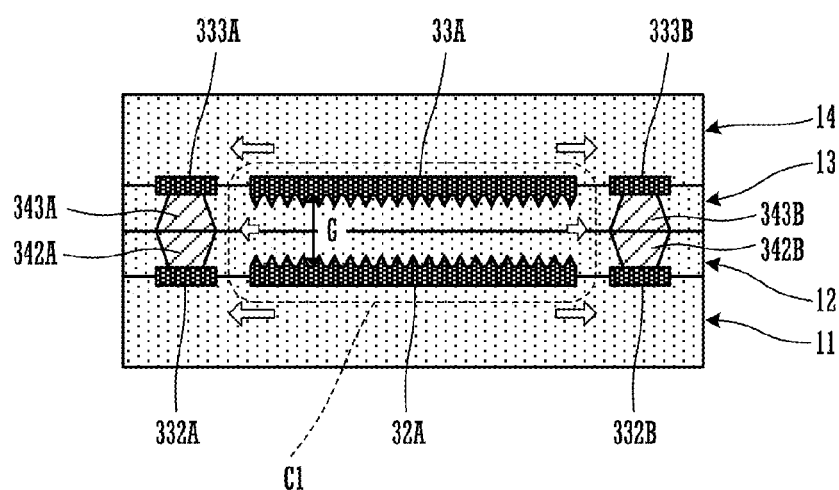
FIG. 12B is an enlarged sectional view showing how the portion to be defined as the capacitor C1 shown in FIG. 9A

FIG. 9A and FIG. 9B are sectional views showing a method of manufacturing the laminated circuit substrate 301 according to the third preferred embodiment of the present invention. FIG. 10 is a front view of a sheet 13 of which only a main portion of the sheet 13 shown in FIG. 9A and FIG. 9B is viewed from the side of the principal surface Z2. FIG. 11 is a front view of a sheet 12 of which only a main portion of the sheet 12 shown in FIG. 9A and FIG. 9B is viewed from the side of the principal surface Z1. FIG. 12A is an enlarged sectional view of a portion to be defined as a capacitor C1 shown in FIG. 9A and FIG. 9B. FIG. 12B is an enlarged sectional view showing how the portion to be defined as the capacitor C1 shown in FIG. 9A and FIG. 9B is being thermocompression bonded.

The laminated circuit substrate 301 according to the third preferred embodiment of the present invention is different from the laminated circuit substrate 101 according to the first preferred embodiment of the present invention in that the laminated circuit substrate 301 is provided with via hole conductors 342A to 342J and 343A to 343J and conductor patterns 332A to 332J and 333A to 333J around the capacitor C1 in the sheets 12 and 13. Since the other configurations of the laminated circuit substrate 301 are the same as the configurations of the laminated circuit substrate 101, the description thereof will be omitted. In addition, the method of manufacturing the laminated circuit substrate 301 is also the same as the method of manufacturing the laminated circuit substrate 101 and thus the description thereof will be omitted.

In the laminated circuit substrate 301, when the sheets 11 to 15 are laminated on each other and thermocompression bonded, resin between the first conductor pattern 32A and the second conductor pattern 33B is prevented from flowing by the via hole conductors 342A to 342J and 343A to 343J. Therefore, at the time of the thermocompression bonding, one of the first conductor pattern 32A and the second conductor pattern 33B is prevented from approaching the other conductor pattern. In other words, this configuration further significantly reduces or prevents a change in element value due to a change in distance between the first conductor pattern 32A and the second conductor pattern 33B.

Fourth Preferred Embodiment

Hereinafter, a description will be made of a laminated circuit substrate 401 according to a fourth preferred embodiment of the present invention.

Figure 13A:
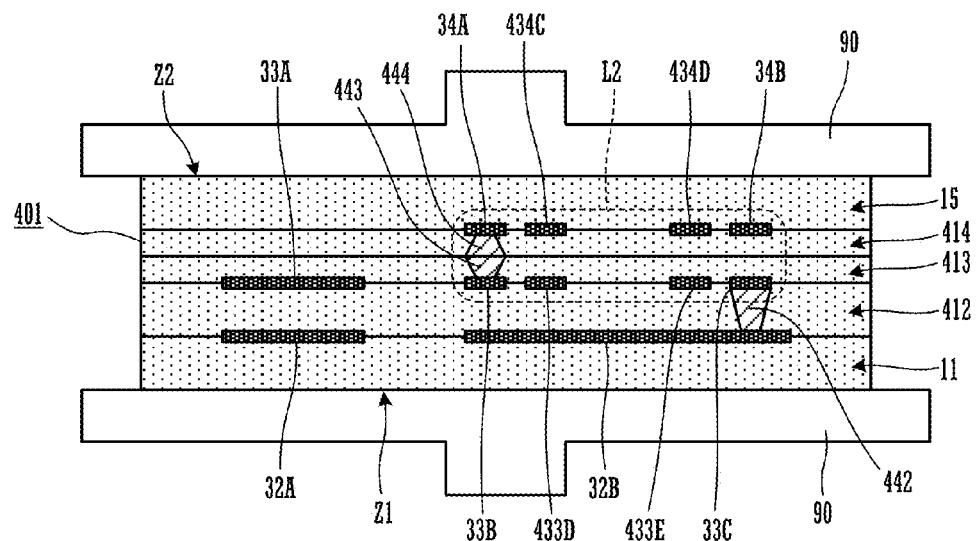
FIG. 13A and FIG. 13B are sectional views showing a method of manufacturing a laminated circuit substrate 401 according to a fourth preferred embodiment of the present invention.
Figure 13B:
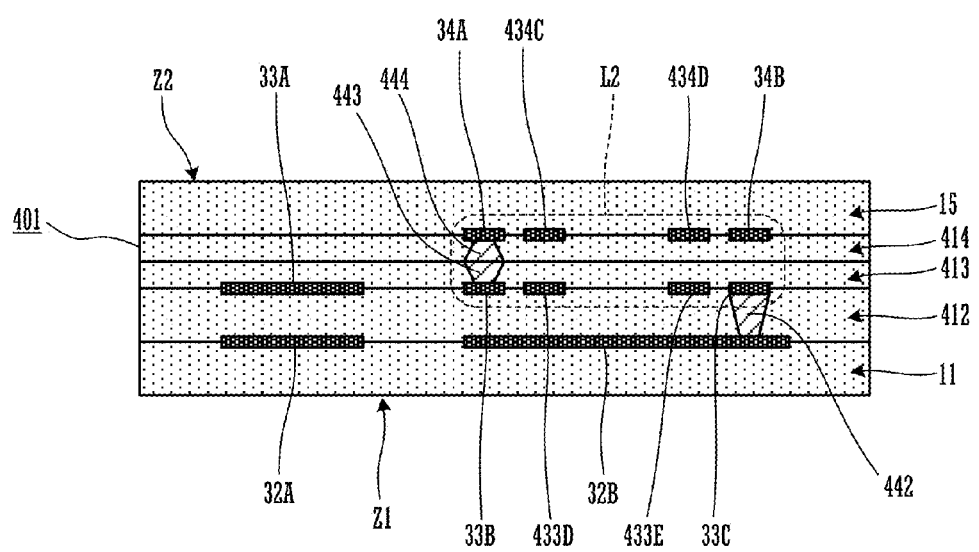
Figure 14A:
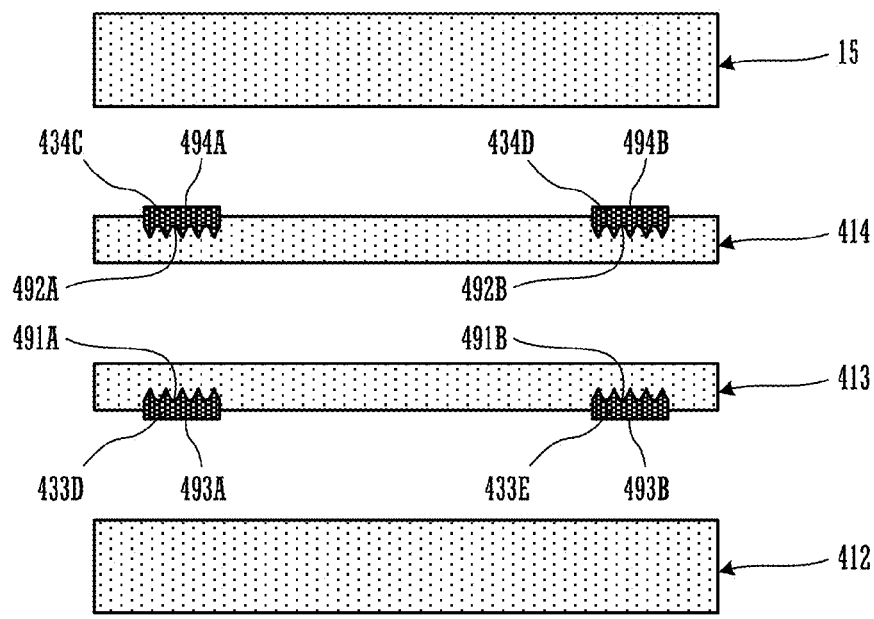
FIG. 14A is an enlarged sectional view of a portion to be defined as a coil L2 shown in FIG. 13A and FIG. 13B. FIG.
Figure 14B:
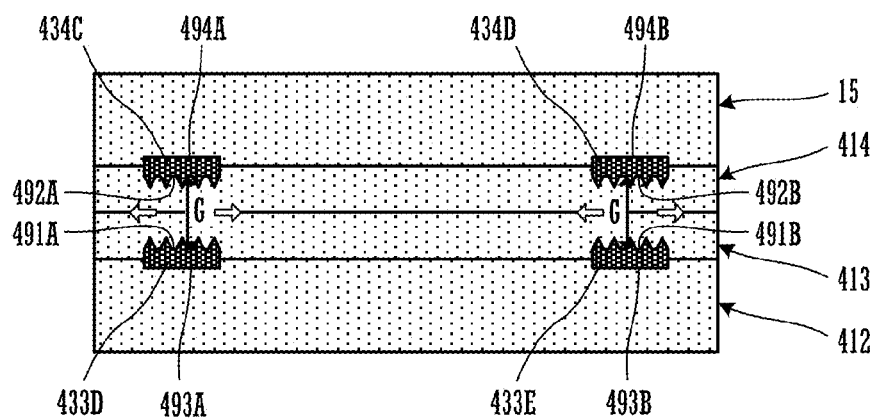

FIG. 13A and FIG. 13B are sectional views showing a method of manufacturing the laminated circuit substrate 401 according to the fourth preferred embodiment of the present invention. FIG. 14A is an enlarged sectional view of a portion to be defined as a coil L2 shown in FIG. 13A and FIG. 13B. FIG. 14B is an enlarged sectional view showing how the portion to be defined as the coil L2 is being thermocompression bonded.

The laminated circuit substrate 401 according to the fourth preferred embodiment of the present invention is different from the laminated circuit substrate 101 according to the first preferred embodiment of the present invention in that the laminated circuit substrate 401 is provided with the coil L2 and sheets 412 to 414 instead of the coil L1 and the sheets 12 to 14. The sheet 412 includes a via hole conductor 442 instead of the via hole conductors 42 and 43 of the sheets 12 and 13. Since the other configurations of the laminated circuit substrate 401 are preferably the same as the configurations of the laminated circuit substrate 101, the description thereof will be omitted. In addition, the method of manufacturing the laminated circuit substrate 401 is also the same as the method of manufacturing the laminated circuit substrate 101 and thus the description thereof will be omitted.

The coil L2 is defined by the conductor patterns 34A, 34B, 33B, and 33C, the via hole conductors 442 to 444, first conductor patterns 433D and 433E, and second conductor patterns 434C and 434D.

Then, in the laminated circuit substrate 401, the roughening process is performed to the first principal surfaces 491A and 491B that face the second conductor patterns 434C and 434D in the first conductor patterns 433D and 433E (see FIG. 14A). Moreover, in the laminated circuit substrate 401, the roughening process is also performed to the second principal surfaces 492A and 492B that face the first conductor patterns 433D and 433E in the second conductor patterns 434C and 434D (see FIG. 14A).

By the roughening process, the surface roughness of the first principal surfaces 491A and 491B is larger than the surface roughness of the third principal surfaces 493A and 493B on the opposite side of the second conductor patterns 434C and 434D in the first conductor patterns 433D and 433E. In addition, the surface roughness of the second principal surfaces 492A and 492B is also larger than the surface roughness of the fourth principal surfaces 494A and 494B on the opposite side of the first conductor patterns 433D and 433E in the second conductor patterns 434C and 434D.

Accordingly, also in the laminated circuit substrate 401, the first principal surface 491A and the second principal surface 492A are rough. Therefore, when the sheets 11, 412 to 414, and 15 are laminated on each other and thermocompression bonded, resin between the first conductor pattern 433D and the second conductor pattern 434C is prevented from flowing by the first principal surface 491A and the second principal surface 492A. Similarly, the first principal surface 491B and the second principal surface 492B are rough. Therefore, when the sheets 11, 412 to 414, and 15 are laminated on each other and thermocompression bonded, resin between the first conductor pattern 433E and the second conductor pattern 434D is prevented from flowing by the first principal surface 491B and the second principal surface 492B.

Thus, at the time of the thermocompression bonding, the resin between the first conductor patterns 433D and 433E and the second conductor patterns 434C and 434D does not flow much to the outside of the portion between the first conductor patterns 433D and 433E and the second conductor patterns 434C and 434D (see the arrows in FIG. 14B).

Then, since the surface roughness of the first principal surfaces 491A and 491B is larger than the surface roughness of the third principal surfaces 493A and 493B, the amount of flow of resin near the first principal surfaces 491A and 491B is smaller than the amount of flow of resin near the third principal surfaces 493A and 493B. In addition, since the surface roughness of the second principal surfaces 492A and 492B is also larger than the surface roughness of the fourth principal surfaces 494A and 494B, the amount of flow of resin near the second principal surfaces 492A and 492B is smaller than the amount of flow of resin near the fourth principal surfaces 494A and 494B. The size of the arrows as shown in FIG. 14B represents the amount of flow of resin.

The amount of flow of resin near the third principal surfaces 493A and 493B and resin near the fourth principal surfaces 494A and 494B is larger than the amount of flow of resin near the first principal surfaces 491A and 491B and resin near the second principal surfaces 492A and 492B.

Thus, the resin near the first principal surfaces 491A and 491B and the resin near the second principal surfaces 492A and 492B become much more difficult to flow to the outside of the portion between the first conductor patterns 433D and 433E and the second conductor patterns 434C and 434D.

Accordingly, also in the laminated circuit substrate 401, the distance G between the first conductor patterns 433D and 433E and the second conductor patterns 434C and 434D that define the coil L2 is prevented from being changed. Therefore, the line capacitance between the first conductor patterns 433D and 433E and the second conductor patterns 434C and 434D is not easily changed. In other words, when the laminated circuit substrate 401 is being manufactured by thermocompression bonding, the designed distance G and line capacitance between the first conductor patterns 433D and 433E and the second conductor patterns 434C and 434D are exactly or almost exactly achieved.

Therefore, even when a temperature or pressure affecting the first conductor patterns 433D and 433E and the second conductor patterns 434C and 434D is changed in some degree at the time of the thermocompression bonding, such an element value (inductance in the present preferred embodiment) of the coil L2 is not easily changed.

Consequently, the laminated circuit substrate 401 also achieves advantages that are the same or substantially the same as the advantages of the laminated circuit substrate 101.

Fifth Preferred Embodiment

Hereinafter, a description will be made of a laminated circuit substrate 501 according to a fifth preferred embodiment of the present invention.

FIG. 15 is an appearance perspective view of a first conductor pattern 32B and a coil L3 included in the laminated circuit substrate 501 according to the fifth preferred embodiment of the present invention. FIG. 16A is an enlarged sectional view of a portion to be defined as the coil L3 shown in FIG. 15. FIG. 16B is an enlarged sectional view showing how the portion to be defined as the coil L3 is being thermocompression bonded. FIG. 16A and FIG. 16B are sectional views taken along line T-T shown in FIG. 15.

The laminated circuit substrate 501 according to the fifth preferred embodiment of the present invention is different from the laminated circuit substrate 101 according to the first preferred embodiment of the present invention in that the laminated circuit substrate 501 is provided with the coil L3 and a sheet 514 instead of the coil L1 and the sheets 13 to 14. Since the other configurations of the laminated circuit substrate 501 are the same as the configurations of the laminated circuit substrate 101, the description thereof will be omitted. In addition, the method of manufacturing the laminated circuit substrate 501 is also the same as the method of manufacturing the laminated circuit substrate 101 and thus the description thereof will be omitted.

The coil L3 is defined by the second conductor patterns 533A to 533D. Then, in the laminated circuit substrate 501, the roughening process is performed to the first principal surface 591 that faces the second conductor patterns 533A to 533D in the first conductor pattern 32B (see FIG. 16A). Moreover, in the laminated circuit substrate 501, the roughening process is performed also to the second principal surfaces 592A to 592D that face the first conductor pattern 32B in the second conductor patterns 533A to 533D (see FIG. 16A).

By the roughening process, the surface roughness of the first principal surface 591 is larger than the surface roughness of the third principal surface 593 on the opposite side of the second conductor patterns 533A to 533D in the first conductor pattern 32B. In addition, the surface roughness of the second principal surfaces 592A to 592D is larger than the surface roughness of the fourth principal surfaces 594A to 594D on the opposite side of the first conductor pattern 32B in the second conductor patterns 533A to 533D.

Accordingly, also in the laminated circuit substrate 501, the first principal surface 591 and the second principal surfaces 592A to 592D are rough. Therefore, when the sheets 11 to 13, and 514 are laminated on each other and thermocompression bonded, resin between the first conductor pattern 32B and the second conductor patterns 533A to 533D is prevented from flowing by the first principal surface 591 and the second principal surfaces 592A to 592D.

Thus, at the time of the thermocompression bonding, the resin between the first conductor pattern 32B and the second conductor patterns 533A to 533D does not flow much to the outside of the portion between the first conductor pattern 32B and the second conductor patterns 533A to 533D (see the arrows in FIG. 16B).

Then, since the surface roughness of the first principal surface 591 is larger than the surface roughness of the third principal surface 593, the amount of flow of resin near the first principal surface 591 is smaller than the amount of flow of resin near the third principal surface 593. In addition, since the surface roughness of the second principal surfaces 592A to 592D is also larger than the surface roughness of the fourth principal surfaces 594A to 594D, the amount of flow of resin near the second principal surfaces 592A to 592D is smaller than the amount of flow of resin near the fourth principal surfaces 594A to 594D. The size of the arrows as shown in FIG. 16B represents the amount of flow of resin.

The amount of flow of resin near the third principal surface 593 and resin near the fourth principal surfaces 594A to 594D is larger than the amount of flow of resin near the first principal surface 591 and resin near the second principal surfaces 592A to 592D. Thus, the resin near the first principal surface 591 and the resin near the second principal surfaces 592A to 592D become much more difficult to flow to the outside of the portion between the first conductor pattern 32B and the second conductor patterns 533A to 533D.

Accordingly, the distance G1 between the first conductor pattern 32B and the second conductor pattern 53A is prevented from being changed, so that the stray capacitance between the first conductor pattern 32B and the second conductor pattern 533A is not easily changed. In addition, the distance G2 between the second conductor patterns 533A and 533B is also prevented from being changed, so that the line capacitance between the second conductor patterns 533A and 533B is not easily changed. The second conductor patterns 533B to 533D that define the coil L3 are similar to the second conductor pattern 533A. In other words, when the laminated circuit substrate 501 is being manufactured by thermocompression bonding, the designed distances G1 and G2, stray capacitance, and line capacitance are exactly or almost exactly achieved.

Therefore, even when a temperature or pressure affecting the first conductor patterns 32B and the second conductor patterns 533A to 533D is changed in some degree at the time of the thermocompression bonding, such an element value (inductance in the present preferred embodiment) of the coil L3 is not easily changed.

Consequently, the laminated circuit substrate 501 also achieves advantages that are the same or substantially the same as the advantages of the laminated circuit substrate 101. Therefore, according to the laminated circuit substrate 501, it is easy to provide a coil L3 having a highly accurate element value (inductance in the present preferred embodiment) of which the individual difference is small.

Sixth Preferred Embodiment

Hereinafter, a description will be made of a laminated circuit substrate 601 according to a sixth preferred embodiment of the present invention.

FIG. 17 is an appearance perspective view of a first conductor pattern 32B and a coil L4 included in the laminated circuit substrate 601 according to the sixth preferred embodiment of the present invention. FIG. 18A is an enlarged sectional view of a portion to be defined as the coil L4 shown in FIG. 17. FIG. 18B is an enlarged sectional view showing how the portion to be defined as the coil L4 is being thermocompression bonded. FIG. 18A and FIG. 18B are sectional views taken along line S-S shown in FIG. 17.

The laminated circuit substrate 601 according to the sixth preferred embodiment of the present invention is different from the laminated circuit substrate 101 according to the first preferred embodiment of the present invention in that the laminated circuit substrate 601 is provided with the coil L4 instead of the coil L1. Since the other configurations of the laminated circuit substrate 601 are the same as the configurations of the laminated circuit substrate 101, the description thereof will be omitted. In addition, the method of manufacturing the laminated circuit substrate 601 is also the same as the method of manufacturing the laminated circuit substrate 101 and thus the description thereof will be omitted.

The coil L4 is defined by the conductor patterns 635A to 635G and the second conductor patterns 633A to 633G. The conductor patterns 635A to 635G are provided on the sheet 15. Moreover, the second conductor patterns 633A to 633G are provided on the sheet 13. It should be noted that the first conductor pattern 32B defines a ground, for example. The first conductor pattern 32B is a conductor pattern of which the area is larger than the total area of the second conductor patterns 633A to 633G.

Then, in the laminated circuit substrate 601, the roughening process is performed to the first principal surface 591 that faces the second conductor patterns 633A to 633G in the first conductor pattern 32B (see FIG. 18A). Moreover, in the laminated circuit substrate 601, the roughening process is performed also to the second principal surfaces 692A to 692G that face the first conductor pattern 32B in the second conductor patterns 633A to 633G (see FIG. 18A).

In the laminated circuit substrate 601 according to the present preferred embodiment, the capacitance of the second conductor patterns 633A to 633G and the first conductor pattern 32B has a larger influence on the element value (inductance in the present preferred embodiment) of the coil 4 than the capacitance of the second conductor patterns 633A to 633G and the conductor patterns 635A to 635G does.

Therefore, in the present preferred embodiment, the roughening process is performed to the first principal surface 591 that faces the second conductor patterns 633A to 633G in the first conductor patterns 32B and the second principal surfaces 692A to 692G that face the first conductor pattern 32B in the second conductor patterns 633A to 633G.

By the roughening process, the surface roughness of the first principal surface 591 is larger than the surface roughness of the third principal surface 593 on the opposite side of the second conductor patterns 633A to 633G in the first conductor pattern 32B. In addition, the surface roughness of the second principal surfaces 692A to 692G is also larger than the surface roughness of the fourth principal surfaces 694A to 694G on the opposite side of the first conductor pattern 32B in the second conductor patterns 633A to 633G.

Accordingly, also in the laminated circuit substrate 601, the first principal surface 591 and the second principal surfaces 692A to 692G are rough. Therefore, when the sheets 11 to 15 are laminated on each other and thermocompression bonded, resin between the first conductor pattern 32B and the second conductor patterns 633A to 633G is prevented from flowing by the first principal surface 591 and the second principal surfaces 692A to 692G.

Thus, at the time of the thermocompression bonding, the resin between the first conductor pattern 32B and the second conductor patterns 633A to 633G does not flow much to the outside of the portion between the first conductor pattern 32B and the second conductor patterns 633A to 633G (see the arrows in FIG. 18B).

Then, since the surface roughness of the first principal surface 591 is larger than the surface roughness of the third principal surface 593, the amount of flow of resin near the first principal surface 591 is smaller than the amount of flow of resin near the third principal surface 593. In addition, since the surface roughness of the second principal surfaces 692A to 692G is also larger than the surface roughness of the fourth principal surfaces 694A to 694G, the amount of flow of resin near the second principal surfaces 692A to 692D is smaller than the amount of flow of resin near the fourth principal surfaces 694A to 694G. The size of the arrows as shown in FIG. 18B represents the amount of flow of resin.

The amount of flow of resin near the third principal surface 593 and resin near the fourth principal surfaces 694A to 694G is larger than the amount of flow of resin near the first principal surface 591 and resin near the second principal surfaces 692A to 692G. Thus, the resin near the first principal surface 591 and the resin near the second principal surfaces 692A to 692G become much more difficult to flow to the outside of the portion between the first conductor pattern 32B and the second conductor patterns 633A to 633G.

Therefore, the distance G1 between the first conductor pattern 32B and the second conductor pattern 633A is prevented from being changed, so that the stray capacitance between the first conductor pattern 32B and the second conductor pattern 633A is not easily changed. In addition, the distance G2 between the second conductor patterns 633A and 633B can also be prevented from being changed, so that the line capacitance between the second conductor patterns 633A and 633B is not easily changed. The other second conductor patterns 633B to 633G that define the coil L4 are similar to the second conductor pattern 633A. In other words, when the laminated circuit substrate 601 is being manufactured by thermocompression bonding, the designed distances G1 and G2, stray capacitance, and line capacitance are exactly or almost exactly achieved.

Therefore, even when a temperature or pressure affecting the first conductor patterns 32B and the second conductor patterns 633A to 633G is changed in some degree at the time of the thermocompression bonding, such an element value (inductance in the present preferred embodiment) of the coil L4 is not easily changed. Moreover, the surface roughness of the internal surface (that is, the second conductor patterns that face each other across the sheet 14) of the coil 4 is comparatively small, which can provide a coil having a large Q value.

Consequently, the laminated circuit substrate 601 also achieves advantages that are the same or substantially the same as the advantages of the laminated circuit substrate 101. Therefore, according to the laminated circuit substrate 601, it is easy to provide a coil L4 having a highly accurate element value (inductance in the present preferred embodiment) of which the individual difference is small.

Finally, the above described preferred embodiments are to be considered in all respects as illustrative and not restrictive. The scope of the present invention is defined by the following claims, not by the foregoing preferred embodiments.

Further, the scope of the present invention is intended to include the scopes of the claims and all possible changes and modifications within the senses and scopes of equivalents.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A laminated circuit substrate comprising:
   a plurality of thermoplastic resin layers laminated on top of each other;
   a first conductor pattern including a first principal surface; and
   a second conductor pattern including a second principal surface; wherein
   the first conductor pattern and the second conductor pattern face each other across at least one layer of the plurality of thermoplastic resin layers;
   the first principal surface faces the second conductor pattern;
   the second principal surface faces the first conductor pattern;
   the first principal surface and the second principal surface are roughened surfaces;
   the first conductor pattern further includes a third principal surface on an opposite side of the second conductor pattern; and
   a surface roughness of the first principal surface is larger than a surface roughness of the third principal surface.

2. The laminated circuit substrate according to claim 1, wherein:
   the second conductor pattern further includes a fourth principal surface on an opposite side of the first conductor pattern; and
   a surface roughness of the second principal surface is larger than a surface roughness of the fourth principal surface.

3. The laminated circuit substrate according to claim 1, wherein the first conductor pattern and the second conductor pattern each are defined by a patterned metal film provided on a surface of one of the thermoplastic resin layers.

4. The laminated circuit substrate according to claim 1, wherein a surface roughness of the first principal surface is a same or substantially a same as a surface roughness of the second principal surface.

5. The laminated circuit substrate according to claim 1, wherein an area of the first principal surface is a same or substantially a same in size as an area of the second principal surface.

6. The laminated circuit substrate according to claim 1, further comprising a via hole conductor around a portion between the first conductor pattern and the second conductor pattern in the thermoplastic resin layers.

7. The laminated circuit substrate according to claim 1, wherein the first conductor pattern and the second conductor pattern define a capacitor.

8. The laminated circuit substrate according to claim 1, wherein the first conductor pattern and the second conductor pattern define an inductor.

9. The laminated circuit substrate according to claim 1, wherein:
the first conductor pattern defines an inductor; and
the second conductor pattern defines a ground.

10. The laminated circuit substrate according to claim 1, wherein an inductor and a capacitor are defined by the first and second conductor and other conductors.

11. The laminated circuit substrate according to claim 10, wherein the coil is defined by linear conductor patterns and a via hole.

12. The laminated circuit substrate according to claim 11, wherein the linear conductor patterns are arranged to overlap with each other in a loop shape when viewed from the lamination direction of the plurality of thermoplastic resin layers.

13. The laminated circuit substrate according to claim 1, further comprising mounting lands on a principal surface and a mounting component mounted on the mounting lands.

14. The laminated circuit substrate according to claim 1, wherein each of the plurality of thermoplastic layers is made of one of liquid crystal polymer and polyimide.

15. The laminated circuit substrate according to claim 1, wherein the roughened surfaces of the first principal surface and the second principal surface are etched surfaces.

16. The laminated circuit substrate according to claim 1, wherein a roughness of the first principal surface and the second principal surface is about 1.3 μm to about 15 μm.

17. The laminated circuit substrate according to claim 2, wherein a roughness of the third principal surface and the fourth principal surface is about 0.1 μm to about 3 μm.

* * * * *